United States Patent
Qian et al.

(10) Patent No.: US 12,220,784 B2
(45) Date of Patent: *Feb. 11, 2025

(54) CHEMICAL MECHANICAL POLISHING PAD AND PREPARATION THEREOF

(71) Applicants: Rohm and Haas Electronic Materials CMP Holdings, Inc., Newark, DE (US); DuPont Electronics, Inc., Wilmington, DE (US)

(72) Inventors: Bainian Qian, Newark, DE (US); Robert M. Blomquist, River Edge, NJ (US); Lyla M. El-Sayed, Boonton, NJ (US); Michael E. Mills, Bear, DE (US); Kancharla-Arun Reddy, Wilmington, DE (US); Bradley K. Taylor, West Chester, PA (US); Shijing Xia, Hockessin, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 520 days.

This patent is subject to a terminal disclaimer.

(21) Appl. No.: 17/500,630

(22) Filed: Oct. 13, 2021

(65) Prior Publication Data

US 2023/0112228 A1    Apr. 13, 2023

(51) Int. Cl.
| | | |
|---|---|---|
| B24B 37/00 | (2012.01) | |
| B24B 37/22 | (2012.01) | |
| B24B 37/24 | (2012.01) | |
| B24B 37/26 | (2012.01) | |
| B24D 3/28 | (2006.01) | |
| H01L 21/306 | (2006.01) | |

(52) U.S. Cl.
CPC ............. B24B 37/22 (2013.01); B24B 37/24 (2013.01); B24B 37/26 (2013.01); B24D 3/28 (2013.01); H01L 21/30625 (2013.01)

(58) Field of Classification Search
CPC ..................... B29C 35/0805; B29C 48/002
See application file for complete search history.

(56) References Cited

U.S. PATENT DOCUMENTS

| | | | |
|---|---|---|---|
| 5,965,460 A | 10/1999 | Rach | |
| 6,036,579 A | 3/2000 | Cook | |
| 6,210,254 B1 | 4/2001 | Cook | |
| 7,329,170 B2 * | 2/2008 | Ono | B24D 11/008 451/526 |
| 8,512,427 B2 | 8/2013 | Xie | |
| 9,067,299 B2 | 6/2015 | Bajaj | |
| 9,457,520 B2 | 10/2016 | Bajaj | |
| 9,744,724 B2 | 8/2017 | Bajaj | |
| 10,029,405 B2 | 7/2018 | Bajaj | |
| 11,679,531 B2 * | 6/2023 | Qian | B29C 48/40 264/477 |
| 2005/0107007 A1 | 5/2005 | Furukawa | |

* cited by examiner

*Primary Examiner* — Nicholas R Krasnow
(74) *Attorney, Agent, or Firm* — Simon L. Xu; Blake T. Biederman

(57) ABSTRACT

The present invention concerns a chemical mechanical polishing pad having a polishing layer. The polishing layer contains an extruded sheet. The extruded sheet is a photopolymerizable composition containing a block copolymer, a UV curable acrylate, and a photoinitiator.

8 Claims, No Drawings

CHEMICAL MECHANICAL POLISHING PAD AND PREPARATION THEREOF

The present invention relates generally to the field of chemical mechanical polishing (CMP) of advanced semiconductor devices. More particularly, the present invention is directed to a CMP pad, and a method of preparing the CMP pad.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a chemical composition ("slurry") or other polishing solution is provided between the wafer and the polishing pad. Thus, the wafer surface is polished and made planar by the chemical and mechanical action of the pad surface and slurry.

A wide variety of compositions and methods have been employed in the preparation of polishing pads.

U.S. Pat. Nos. 6,036,579 and 6,210,254 disclose polymeric polishing pads having photolithographically induced surface pattern(s). The photolithography enables the creation of useful surface patterns not possible with conventional machining techniques and enables the use of pad materials otherwise too soft to pattern by conventional machining techniques.

U.S. Pat. No. 7,329,170 discloses method of producing a polishing pad having a polishing layer that is produced by a photolithographic method. The method includes forming a sheet molding from a curing composition containing at least an initiator and an energy ray-reactive compound to be cured with energy rays; exposing the sheet molding to energy rays to induce modification thereof, to change the solubility of the sheet molding in a solvent; and developing the sheet molding after irradiation with energy rays, to partially remove the curing composition with a solvent thereby forming a concave-convex pattern on the surface.

US Patent Application Publication No. 20050107007 discloses a polishing pad comprising nonwoven fabric as a base matrix, and a nonporous photo-setting resin that fills the space between the nonwoven fabric. The photo-setting resin composition containing at least one member selected from the group consisting of a hydrophilic photopolymeric polymer or oligomer, and/or a hydrophilic photopolymeric monomer.

U.S. Pat. Nos. 9,067,299, 10,029,405, 9,457,520, and 9,744,724 disclose methods of fabricating a polishing layer of a polishing pad including successively depositing a plurality of layers with a 3D printer, each layer of the plurality of polishing layers deposited by ejecting a pad material precursor from a nozzle and solidifying the pad material precursor to form a solidified pad material.

U.S. Pat. No. 5,965,460 discloses polishing pads constructed with polyurethane photopolymers. The polyurethane photopolymers are formed by reacting a polyurethane prepolymer with acrylates and/or methacrylates. The polyurethane prepolymer is reaction products of a reactant selected from the group consisting of polyesters, polyethers, polybutadienes and mixtures thereof with diisocyanates.

U.S. Pat. No. 8,512,427 discloses a chemical mechanical polishing pad comprising an acrylate polyurethane polishing layer, wherein the polishing layer exhibits a tensile modulus of 65 to 500 MPa; an elongation to break of 50 to 250%; a storage modulus of 25 to 200 MPa; a Shore D hardness of 25 to 75; and a wet cut rate of 1 to 10 μm/min.

A need exists for an improved chemical mechanical polishing pad having higher CMP planarization performance and productivity. The present invention satisfies this need by providing a CMP pad having a polishing layer that contains an extruded sheet formed by extrusion and subsequent UV curing of a photopolymerizable composition comprising a block copolymer, a UV curable acrylate, a photoinitiator, and optionally, an oil and/or a dye to improve polishing performance.

SUMMARY OF THE DISCLOSURE

An embodiment provides a chemical mechanical (CMP) polishing pad suitable for polishing at least one of a semiconductor substrate, an optical substrate and a magnetic substrate, the polishing pad having a polishing layer with an optional sub-pad, the polishing layer comprising an extruded sheet, the extruded sheet comprising a photopolymerizable composition comprising a block copolymer, a UV curable acrylate, and a photoinitiator, wherein said block copolymer is present at an amount of greater than 50 wt %, based on the total weight of the extruded sheet, and wherein upon curing by actinic radiation, the extruded sheet having a Shore D hardness in the range of 40 to 70.

Another embodiment provides that the photopolymerizable composition further comprising an oil.

Another embodiment provides that the block copolymer is a triblock copolymer.

Another embodiment provides that the triblock copolymer is a styrenic block copolymer or a polyurethane block copolymer.

Another embodiment provides that the stryrenic block copolymer is one or more members selected from the group consisting of a styrene-butadiene-styrene (SBS) block copolymer, a styrene-isoprene-styrene (SIS) block copolymer, a styrene-ethylene-butene-styrene (SEBS) block copolymer, a styrene-ethylene-propylene-styrene (SEPS) block copolymer, and mixtures thereof.

Another embodiment provides that the block copolymer is present at an amount of greater than 65%.

Another embodiment provides that the acrylate is one or more members selected from the group consisting of 1,3- butylene glycol diacrylate, 1,4-butanediol diacrylate, 1,4-butanediol dimethacrylate, 1,6-hexanediol diacrylate, and mixtures thereof.

Another embodiment provides that the extruded sheet having a Shore D hardness in the range of 45 to 65.

Another embodiment provides that the extruded sheet having a Shore D hardness in the range of 45 to 55.

Another embodiment provides that the photopolymerizable composition does not contain any organic solvent.

Another embodiment provides that the photopolymerizable composition further comprising a plasticizer.

Another embodiment provides a process for making an extruded sheet to be used as a polishing layer in a chemical mechanical polishing pad suitable for polishing at least one of a semiconductor substrate, an optical substrate and a magnetic substrate, the process comprising:

(a) compounding a photopolymerizable composition comprising a block copolymer, a UV curable acrylate, and a photoinitiator in an extruder;

(b) extruding the compounded mixture of step (a) onto a support through a sheet die;

(c) passing the product of step (b) through a plurality of calendar rolls; and (d) exposing the product of step (c) to actinic radiation; wherein said block copolymer is present at an amount of greater than 50 wt %, based on the total weight of the extruded sheet, and wherein after the UV curing in step (d), the polishing layer having a Shore D hardness in the range of 40 to 70.

Another embodiment provides that the process further comprising an embossing step between steps (c) and (d) to create a pattern on the product of step (c).

Yet another embodiment provides that the extruder is a twin screw extruder.

These and other features and advantages of the present embodiments will be more readily understood by those of ordinary skill in the art from a reading of the following Detailed Description. Certain features of the disclosed embodiments which are, for clarity, described above and below as separate embodiments, may also be provided in combination in a single embodiment. Conversely, various features of the disclosed embodiments that are described in the context of a single embodiment, may also be provided separately or in any subcombination.

DETAILED DESCRIPTION

Unless otherwise stated or defined, all technical and scientific terms used herein have commonly understood meanings by one of ordinary skill in the art to which this disclosure pertains.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative.

As used herein, the term "ASTM" refers to publications of ASTM International, West Conshohocken, PA.

As used herein, unless otherwise indicated, the term "molecular weight" or "average molecular weight" means a formula weight for a given material as reported by its manufacturer. An average molecular weight refers to the molecular weight reported for a distribution of molecules in a given material, e.g. a polymer distribution.

As used herein, the term "semiconductor wafer" is intended to encompass a semiconductor substrate, such as an unpatterned semiconductor or one having a pattern, a semiconductor device, various packages for various levels of interconnection, including a single-chip wafer or a multiple-chip wafer, a substrate for a light emitting diode (LED), or other assemblies requiring solder connections.

As used herein, the term "semiconductor substrate" is defined to mean any construction comprising semiconductive material. A semiconductor substrate includes semiconductor devices and any substrate having one or more semiconductor layers or structures which include active or operable portions of semiconductor devices.

As used herein, the term "semiconductor device" refers to a semiconductor substrate upon which at least one microelectronic device has been or is being fabricated.

As used herein, the terms "Shore D hardness" and "Shore A hardness" are the hardness values of a given material as measured after a given time period according to ASTM D2240-15 (2015), "Standard Test Method for Rubber Property—Durometer Hardness". Hardness was measured on a Rex Hybrid hardness tester (Rex Gauge Company, Inc., Buffalo Grove, IL), equipped, respectively, with a D or A probe. Four samples were stacked and shuffled for each hardness measurement; and each specimen tested was conditioned by placing it in 50 percent relative humidity for five days at 23° C. before testing and using methodology outlined in ASTM D2240-15 (2015) to improve the repeatability of the hardness tests.

As used herein, the term "radiation", "irradiation" or "actinic radiation" means radiation that causes, typically in the presence of a photoinitiator, polymerization of monomers and/or oligomers that have ethylenically unsaturated double bonds, such as acrylic or methacrylic double bonds. Actinic radiation can include ultraviolet radiation, visible light, and e-beam radiation. Sources of actinic radiation may be natural sunlight or artificial radiation sources. Examples of ultraviolet radiation as actinic radiation include, but is not limited to, UV-A radiation, which falls within the wavelength range of from 320 nanometers (nm) to 400 nm; UV-B radiation, which is radiation having a wavelength falling in the range of from 280 nm to 320 nm; UV-C radiation, which is radiation having a wavelength falling in the range of from 100 nm to 280 nm; and UV-V radiation, which is radiation having a wavelength falling in the range of from 400 nm to 800 nm.

The term "photoinitiator" is a compound that promotes polymerization reaction and decomposes into radicals when exposed to radiation. Photoinitiator encompasses one or more compounds, which individually or together, promote polymerization reaction.

Unless otherwise noted, the above chemicals were obtained from Aldrich (Milwaukee, WI) or other similar suppliers of laboratory chemicals.

In addition, references in the singular may also include the plural (for example, "a" and "an" may refer to one, or one or more) unless the context specifically states otherwise.

The polishing layer in the chemical mechanical polishing pad provided in the present invention comprises an extruded sheet. The extruded sheet comprises a composition comprising a block copolymer, a UV curable acrylate, and a photoinitiator. The block copolymer is present at an amount of greater than 50 wt %, more preferably, 60 wt %, and most preferably, 65 wt %, based on the total weight of the extruded sheet. Upon UV curing, the extruded sheet has a Shore D hardness in the range of 40 to 70, more preferably, 45 to 65, and most preferably, 45 to 55 as measured according to ASTM D2240.

Preferably, the block copolymer is a styrenic block copolymer or a polyurethane block copolymer. Preferably, the stryrenic block copolymer is one or more members selected from the group consisting of a styrene-butadiene-styrene (SBS) block copolymer, a styrene-isoprene-styrene (SIS) block copolymer, a styrene-ethylene-butene-styrene (SEBS) block copolymer, a styrene-ethylene-propylene-styrene (SEPS) block copolymer, and mixtures thereof. More preferably, the stryrenic block copolymer is a styrene-butadiene-styrene (SBS) block copolymer or a styrene-isoprene-styrene (SIS) block copolymer. Most preferably, the stryrenic block copolymer is a styrene-butadiene-styrene (SBS) block copolymer.

Preferably, the UV curable acrylate is one or more members selected from the group consisting of 1,3-butylene glycol diacrylate, 1,4-butanediol diacrylate, 1,4-butanediol dimethacrylate, 1,6-hexanediol diacrylate, and mixtures thereof. Suitable UV curable acrylates include, but not limited to, 1,3-butylene glycol dimethacrylate, 1,4-butanediol dimethacrylate, 1,6-hexanediol dimethacrylate, 2-phenoxyethyl acrylate, 2-phenoxyethyl methacrylate, 2-(2-ethoxyethoxy)ethylacrylate, alkoxylated cyclohexane dimethanol diacrylate, alkoxylated hexanediol diacrylate, alkoxylated lauryl acrylate, alkoxylated neopentyl glycol diacrylate, alkoxylated phenol acrylate, alkoxylated tetrahydrofurfuryl acrylate, aromatic dimethacrylate monomer, caprolactone acrylate, cyclohexane dimethanol diacrylate, cyclohexane dimethanol dimethacrylate, dibutoxyethoxyethyl adipate, dibutoxyethoxyethyl acrylate, diethylene glycol diacrylate, diethylene glycol diacrylate, diethylene glycol dimethacrylate, dipentaerythritol pentaacrylate, dipropylene glycol diacrylate, ethoxylated bisphenol a diacrylate, ethoxylated bisphenol a dimethacrylate, ethoxylated hydroxyethyl methacrylate, ethoxylated nonyl phenol acrylate, ethoxylated nonyl phenol methacrylate, ethoxylated nonyl phenol methacrylate, ethoxylated pentaerythritol tetraacrylate, ethoxylated trimethylolpropane triacrylate, ethylene glycol dimethacrylate, isobornyl acrylate, isobornyl methacrylate, isodecyl acrylate, isodecyl methacrylate, lauryl acrylate, lauryl methacrylate, methoxy polyethylene glycol monoacrylate, methoxy polyethylene glycol monomethacrylate, neopentyl glycol diacrylate, neopentyl glycol dimethacrylate, pentaerythritol tetraacrylate, pentaerythritol triacrylate, polyethylene glycol diacrylate, polyethylene glycol dimethacrylate, polypropylene glycol monomethacrylate, propoxylated allyl methacrylate, propoxylated glyceryl triacrylate, propoxylated neopentyl glycol diacrylate, propoxylated trimethylolpropane triacrylate, stearyl acrylate, tetraethylene glycol diacrylate, tetraethylene glycol dimethacrylate, tetrahydrofurfuryl acrylate, tetrahydrofurfuryl methacrylate, tricyclodecane dimethanol diacrylate, tridecyl acrylate, triethylene glycol diacrylate, triethylene glycol dimethacrylate, trimethylolpropane triacrylate, and trimethylolpropane trimethacrylate.

Preferably, at least one photoinitiator is employed and is present at an amount from about 0.1 wt % to about 15 wt % based on the total weight of the extruded sheet. The one or more photoinitiators can be between and optionally include any two of the following values: 0.1, 0.2, 0.3, 0.4, 0.5, 1, 3, 5, 7, 9, 11, 13, and 15 wt %, based on the total weight of the extruded sheet. More preferably, the one or more photoinitiators are present in an amount from about 1 to about 5 wt % based on the total weight of the extruded sheet. In most embodiments, the photoinitiator is sensitive to visible or ultraviolet radiation.

As known to those skilled in the art, many photoinitiators can be suitable for the invention described herein. These include, but are not limited to, quinones; phenanthraquinones; polynuclear quinones; benzophenones; benzoin ethers, such as for example, benzoinmethyl ethers, benzoin-n-butyl ethers, benzoin-iso-butyl ethers; ketones, such as, for example, aryl ketones, oxysulfonyl ketones, sufonyl ketones, amino ketones; propiophenones; acetophenones, such as hydroxy alkyl phenyl acetophone, dialkoxy acetophenone, and 2, 2-diethoxyacetophenones; alpha halogen acetopheones; 1-hydroxycyclohexyl phenyl ketones; thiophenylmorpholino ketones; thioxanthones; methylphenylgloxylates; ethylphenylpyloxylates; acylphosphine oxides; alkoxyphenyl-substituted phosphine oxides, such as, for example, bis(2,4,6, trimethyl benzoyl)-phenyl phosphine oxide, diphenyl (2,4,6-trimethylbenzoyl)-phosphine oxide; peroxides; biimidazoles; benzoyl oxime esters; borates; and, Michler's ketones.

The photopolymerizable composition can contain other additives depending on the final properties desired for the extruded sheet. Additional additives to the extruded sheet composition include sensitizers, plasticizers, rheology modifiers, thermal polymerization inhibitors, colorants, processing aids, antioxidants, antiozonants, dyes, and fillers.

The thickness of the extruded sheet can vary over a wide range depending upon the type of polishing pads desired. Preferably, the extruded sheet has an average thickness of 20 to 150 mils; more preferably 30 to 125 mils; most preferably 40 to 120 mils.

Process

The process of preparing an extruded sheet to be used as a polishing layer in a chemical mechanical polishing pad includes the steps of:

(a) compounding a photopolymerizable composition comprising a block copolymer, a UV curable acrylate, and a photoinitiator in an extruder;

(b) extruding the compounded mixture of step (a) onto a support through a sheet die;

(c) passing the product of step (b) through a plurality of calendar rolls; and (d) exposing the product of step (c) to actinic radiation;

wherein said block copolymer is present at an amount of greater than 50 wt %, based on the total weight of the polishing layer, and wherein after the UV curing in step (d), the extruded sheet having a Shore D hardness in the range of 40 to 70.

In step (a), a photopolymerizable composition comprising a block copolymer, a UV curable acrylate, and a photoinitiator is compounded in an extruder. Preferably, the extruder is a twin screw extruder, a single screw compounding kneader, or a planetary roller extruder. Preferably, the composition is compounded without the presence of any organic solvent.

In step (b), the compounded mixture of step (a) is extruded onto a support through a sheet die. Typically, the support is a polymeric film such as a polyester (PET) film. More typically, the support is a thermoplastic sheet.

In step (c), the product of step (b) is passed through a plurality of calendar rolls to form a flat photocurable layer on the support. Optionally, this layer is embossed to create a pattern on the surface.

Typically, thermal embossing is employed when there is a need to create a pattern on the surface of the photocurable layer. Thermal embossing is a common graphic arts technique used to impart a raised surface onto substrates. It is commonly used for embossing paper, foils and plastic films. It is capable of submicron resolution, and is commonly used to reproduce surface holograms.

Thermal embossing begins by using a master image, which has a raised pattern matching the desired pattern in the final product. This master can be either flat or round, with the latter being used for high speed roll-to-roll applications. These masters can be anything with a raised surface. One common method of making a master involves either mechanical or laser etching methods. These masters can also be made by a photolithographic process as is commonly done in the case of holograms.

In step (d), the product of step (c) is exposed to actinic radiation to cure the photopolymerizable composition in the photocurable layer.

In some embodiments, curing is effected by exposure of the photocurable layer to actinic radiation, which in most embodiments is ultraviolet radiation. Examples of actinic radiation include, but are not limited to, UV-A radiation, which falls within the wavelength range of from 320 nanometers (nm) to 400 nm; UV-B radiation, which is radiation having a wavelength falling in the range of from 280 nm to 320 nm; UV-C radiation, which is radiation having a wavelength falling in the range of from 100 nm to 280 nm; and UV-V radiation, which is radiation having a wavelength falling in the range of from 400 nm to 800 nm. Other examples of radiation can include electron-beam, also known as e-beam. Many artificial radiation sources emit a spectrum of radiation that contains UV radiation having wavelengths shorter than 320 nm. Actinic radiation of wavelengths shorter than 320 nm emits high energy and can cause damage to the skin and eyes. Radiation with longer wavelengths, such as UV-A or UV-V, emits lower energy and is considered safer than radiations with shorter wavelengths, such as UV-C or UV-B. In some embodiments, the actinic radiation is ultraviolet radiation between 300 and 400 nm. In some other embodiments, the actinic radiation is ultraviolet radiation between 200 and 450 nm.

The actinic radiation exposure time can vary from a few seconds to tens of minutes, depending upon the intensity and spectral energy distribution of the radiation, its distance from the photocurable layer, and the nature and amount (e.g., thickness of the layer) of the photocurable composition. The layer of curable composition is exposed to actinic radiation in one embodiment from about 0.5 to about 20 minutes, and in another embodiment from about 0.5 to 10 minutes. Exposure temperatures are preferably ambient or slightly higher, i.e., about 20° to about 35° C. Exposure is of sufficient duration and energy to crosslink the exposed areas of the layer down to the supporting substrate. In some embodiments, the total radiant exposure energy (sometimes also referred to as fluence, or energy density) necessary to fully cure the layer is from about 1000 to about 30000 mJoules/cm$^2$, and in other embodiments is from about 1500 to about 20000 mJoules/cm$^2$.

Examples of suitable visible and UV sources include carbon arcs, mercury-vapor arcs, fluorescent lamps, electron flash units, electron beam units, lasers, LEDs, and photographic flood lamps. In one embodiment, a suitable source of UV radiation is one or more mercury vapor lamps. A mercury vapor lamp can be used at a distance of about 1.5 to about 60 inches (about 3.8 to about 153 cm) in some embodiments, and about 1.5 to about 15 inches (about 3.8 to about 38.1 cm) in other embodiments, from the layer of curable composition.

Preferably, the polishing surface of the polishing layer is adapted for polishing the substrate by imparting the polishing surface with a macrotexture. More preferably, the polishing surface is adapted for polishing the substrate by imparting the polishing surface with a macrotexture, wherein the macrotexture is selected from at least one of perforations and grooves. Perforations can extend from the polishing surface part way or all the way through a thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, the polishing surface is adapted for polishing the substrate by imparting the polishing surface with a macrotexture, wherein the macrotexture comprises a groove pattern formed in the polishing layer at the polishing surface. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

Preferably, the polishing layer of the chemical mechanical polishing pad of the present invention has an average thickness of 20 to 150 mils; more preferably 30 to 125 mils; most preferably 40 to 120 mils.

Preferably, the polishing layer of the chemical mechanical polishing pad of the present invention can be provided in both porous and nonporous (i.e., unfilled) configurations. Preferably, the polishing layer has a density of 0.6 g/cm$^3$ as measured according to ASTM D1622. More preferably, the polishing layer has a density of 0.7 to 1.2 g/cm$^3$ (more preferably, 0.8 to 1.1; most preferably, 0.95 to 1.05) as measured according to ASTM D1622.

Preferably, the polishing layer has an elongation to break of 100 to 500% (more preferably, 150 to 450%; most preferably, 200 to 400%) as measured according to ASTM D412.

Preferably, the polishing layer has a toughness of 10 to 50 MPa (more preferably, 15 to 40 MPa; most preferably, 20 to 30 MPa) as measured according to ASTM D1708-10.

Preferably, the polishing layer has a tensile strength of 5 to 35 MPa (more preferably, 7.5 to 20 MPa; most preferably, 10 to 15 MPa) as measured according to ASTM D1708-10.

Preferably, the chemical mechanical polishing pad provided in the present invention is adapted to be interfaced with a platen of a polishing machine. More preferably, the chemical mechanical polishing pad provided in the present invention is adapted to be affixed to the platen of a polishing machine. Most preferably, the chemical mechanical polishing pad provided in the present invention is designed to be affixed to the platen using at least one of a pressure sensitive adhesive and vacuum. Preferably, the chemical mechanical polishing pad provided in the present invention further comprises a platen adhesive, wherein the platen adhesive is disposed on a side of the chemical mechanical polishing pad opposite the polishing surface.

Preferably, the chemical mechanical polishing pad provided in the present invention further comprises at least one additional layer interfaced with the polishing layer. Preferably, the chemical mechanical polishing pad provided in the present invention further comprises a compressible base layer adhered to the polishing layer. The compressible base layer preferably improves conformance of the polishing layer to the surface of the substrate being polished. Preferably, the compressible base layer is adhered to the polishing layer via a stack adhesive interposed between the compressible base layer and the polishing layer. Preferably, the stack adhesive is selected from the group consisting of a pressure sensitive adhesive, a hot melt adhesive, a contact adhesive and combinations thereof. More preferably, the stack adhesive is selected from the group consisting of a pressure sensitive adhesive and a hot melt adhesive. Most preferably, the stack adhesive is a reactive hot melt adhesive.

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad provided in the method of the present invention, optionally further comprises an endpoint detection window. Preferably, the endpoint detection window is selected from an integral window incorporated into the polishing layer; and, a plug in place endpoint detection window block incorporated into the chemical mechanical polishing pad provided.

The following examples illustrate the present invention without, however, being limited thereto.

Examples

Examples of the current invention were made using a Werner Pfleiderer 40 mm, 12 barrel, twin screw extruder. All material ingredients were metered into the twin screw extruder, mixed, degassed, pumped into a sheet die, and then passed between two calendar rolls where they were mated with two pieces of PET film. One of these PET films was treated with a silicone release agent, so that the coversheet could be removed prior to use. Material compositions for the two examples are shown in the Table 1 below.

TABLE 1

| Example | Block copolymer (wt %) | UV curable acrylate (wt %) | Photo-initiator (wt %) | Stabilizer (wt %) | Polybutadiene oil (wt %) |
| --- | --- | --- | --- | --- | --- |
| PP-1 | 87 | 9.4 | 2.4 | 1.2 | 0 |
| PP-2 | 77 | 9.4 | 2.4 | 1.2 | 10 |

Examples of block copolymer include Kraton D1162 from Kraton Corporation and Styrolux 684D from INEOS Styrolution America LLC. Hexanediol diacrylate from Sartomer was used as UV curable acrylate. Benzil Dimethyl Ketal (BDK) from BASF was used as photoinitiator.

The twin screw extruder was rotating at 300 rpm. The first barrel of the twin screw extruder was set at 50° C. to avoid premature melting of the block copolymer. The other 11 barrels were set from 180° C. to about 100° C. in decreasing order. The sheet die was set at between 130° C. to 140° C. and calendar rolls at about 90° C.

After extrusion, the sheet samples were placed in a Cyrel® 2001E exposure unit and exposed to UV light for 360 seconds on each side. The extruded sheet was 80 mil thick, cut to 35.5" by 35.5" squares for finishing as top layers of CMP polishing pads.

The UV cured extruded sheets had densities close to 1.0 and hardness close to 50 Shore D measured at 2 seconds as shown in Table 2 below.

TABLE 2

| UV Cured Sheet | Density (g/cm³) | Shore D (2 sec) | Shore D (15 sec) | Tensile Strength (MPa) | Elongation to break |
| --- | --- | --- | --- | --- | --- |
| PP-1 | 0.98 | 47 | 45 | 12.7 | 278% |
| PP-2 | 1.01 | 51 | 48 | 12.0 | 231% |

Polishing Evaluation

CMP polishing pads were constructed using polishing layers of UV cured sheet of PP-1 and PP-2 for polishing tungsten film on a wafer substrate. These polishing layers were machine grooved to provide a groove pattern in the polishing surface comprising a plurality of concentric circular grooves having the following dimensions: K7 grooves of 0.76 mm (30 mil) depth, 0.51 mm (20 mil) width, and 1.78 mm (70 mil) pitch, with additional 32 counts of radial grooves of 0.76 mm (30 mil) depth and 0.76 mm (30 mil) width.

The polishing layers were then laminated to a SUBA IV sub-pad layer, available from Rohm and Haas Electronic Materials CMP Inc., using reactive hot melt. The resulting pads were mounted to the polishing platen using a double-sided pressure sensitive adhesive film. The final pad had a diameter of 775 mm (30.5"). VP6000, a commercial polishing pad from Rohm and Haas, was also finished with the same groove pattern and sub-pad configuration to be used as a control pad.

A CMP polisher, Reflexion® LK from Applied Materials (Santa Clara, CA), was used to polish 300 mm tungsten wafers. Polishing conditions included a downforce of 3.1 psi, a platen speed of 80 rpm, a carrier speed of 81 rpm, and a polishing medium flow rate of both 100 and 200 ml/min.

A tungsten bulk slurry (NOVAPLANE™ 3510) was used for polishing evaluation. The tungsten bulk slurry comprises 2.0 wt % of ultra-high purity colloidal silica particles of ~60 nm in diameter, 2 wt % of $H_2O_2$, with a pH around 2.5.

Prior to polishing, a conditioning disk LPX-W (Saesol Diamond Ind. Co., Ltd, Gyeonggi-do, Korea) was used for CMP polishing pad break-in and conditioning. Each new pad was broken in for 30 min at 9 lbf (40 N) down-force. During polishing, 24s ex-situ conditioning at 7.5 lbf (33 N) was used between wafer polishing. Ten dummy wafers were polished followed by three wafers for which polishing removal rates were determined.

The removal rate (RR) was determined by measuring the film thickness before and after polishing using an ASET F5X metrology tool (KLA-Tencor, Milpitas, CA) running a 65 point spiral scan with a 3 mm edge exclusion for TEOS films, and a RS200 metrology tool (KLA-Tencor, Milpitas, CA) running a 65 point diameter scan with 5 mm edge exclusion for W films.

The RR results for W and tetraethoxysilane (TEOS) oxide polishing at slurry flow rates of 100 ml/min and 200 ml/min are summarized in Tables 3 and 4 below, respectively. Both inventive pads showed good tunability of W RR and W/TEOS RR selectivity.

TABLE 3

| | Slurry flow rate at 100 ml/min | | |
|---|---|---|---|
| Pad | AVG W RR (A/min) | AVG TEOS RR (A/min) | W/TEOS RR selectivity |
| Control VP6000 | 2046 | 479 | 4.3 |
| PP1 | 1061 | 294 | 3.6 |
| PP2 | 2095 | 311 | 6.7 |

TABLE 4

| | Slurry flow rate at 200 ml/min | | |
|---|---|---|---|
| Pad | AVG W RR (A/min) | AVG TEOS RR (A/min) | W/TEOS RR selectivity |
| Control VP6000 | 2360 | 542 | 4.4 |
| PP1 | 1238 | 345 | 3.6 |
| PP2 | 2024 | 348 | 5.8 |

We claim:

1. A chemical mechanical polishing pad suitable for polishing at least one of a semiconductor substrate, an optical substrate and a magnetic substrate, the polishing pad having a polishing layer, the polishing layer being cured from an extruded sheet, the extruded sheet comprising a photopolymerizable composition comprising a styrenic block copolymer, a UV curable acrylate, polybutadiene oil and a photoinitiator, wherein said styrenic block copolymer is one or more members selected from the group consisting of a styrene-butadiene styrene (SBS) block copolymer, a styrene-isoprene-styrene (SIS) block copolymer, a styrene-ethylene-butene-styrene (SEBS) block copolymer a styrene-ethylene-propylene-styrene (SEPS) block copolymer, and mixtures thereof and the styrenic block copolymer is present at an amount of greater than 50 wt %, based on the total weight of the extruded sheet, and wherein upon UV curing, the extruded sheet having a Shore D hardness in the range of 40 to 70.

2. The chemical mechanical polishing pad of claim 1, wherein said photopolymerizable composition further comprising an oil.

3. The chemical mechanical polishing pad of claim 1, wherein said styrenic block copolymer is a triblock copolymer.

4. The chemical mechanical polishing pad of claim 1, wherein said styrenic block copolymer is present at an amount of greater than 65%.

5. The chemical mechanical polishing pad of claim 1, wherein said acrylate is one or more members selected from the group consisting of 1,3-butylene glycol diacrylate, 1,4-butanediol diacrylate, 1,4-butanediol dimethacrylate, 1,6-hexanediol diacrylate, and mixtures thereof.

6. The chemical mechanical polishing pad of claim 1, wherein the extruded sheet after UV curing having a Shore D hardness in the range of 45 to 55.

7. The chemical mechanical polishing pad of claim 1, wherein said photopolymerizable composition does not contain any organic solvent.

8. The chemical mechanical polishing pad of claim 1, wherein said photopolymerizable composition further comprising a plasticizer.

* * * * *